United States Patent
Ahn

(10) Patent No.: US 10,995,401 B2
(45) Date of Patent: May 4, 2021

(54) SPUTTERING TARGET AND MANUFACTURING METHOD THEREOF

(71) Applicant: SK hynix Inc., Icheon (KR)

(72) Inventor: Jun Ku Ahn, Hwaseong (KR)

(73) Assignee: SK hynix Inc., Icheon (KR)

( * ) Notice: Subject to any disclaimer, the term of this patent is extended or adjusted under 35 U.S.C. 154(b) by 11 days.

(21) Appl. No.: 16/510,274

(22) Filed: Jul. 12, 2019

(65) Prior Publication Data

US 2020/0181761 A1   Jun. 11, 2020

(30) Foreign Application Priority Data

Dec. 7, 2018   (KR) .................. 10-2018-0157444

(51) Int. Cl.
| | |
|---|---|
| *H01J 37/34* | (2006.01) |
| *C23C 14/34* | (2006.01) |
| *C23C 14/06* | (2006.01) |
| *C23C 14/54* | (2006.01) |
| *B23P 15/26* | (2006.01) |

(52) U.S. Cl.
CPC .............. *C23C 14/34* (2013.01); *B23P 15/26* (2013.01); *C23C 14/0617* (2013.01); *C23C 14/541* (2013.01); *H01J 37/3435* (2013.01); *H01J 37/3497* (2013.01)

(58) Field of Classification Search
CPC .............. H01J 37/3435; H01J 37/3497; C23C 14/0605; C23C 14/0617; C23C 14/34; C23C 14/3407; C23C 14/541; B23P 15/26
USPC .......................... 204/298.12, 298.09, 298.13
See application file for complete search history.

(56) References Cited

U.S. PATENT DOCUMENTS

| | | | |
|---|---|---|---|
| 5,428,882 A | | 7/1995 | Makowiecki et al. |
| 6,068,742 A | * | 5/2000 | Daxinger ............ C23C 14/3407 204/298.09 |
| 2005/0236270 A1 | | 10/2005 | Cheng et al. |
| 2017/0268122 A1 | | 9/2017 | Kim et al. |

FOREIGN PATENT DOCUMENTS

| | | | |
|---|---|---|---|
| JP | 63-045368 | * | 2/1988 |
| JP | 63-219574 | * | 9/1988 |
| JP | 2009-256698 | * | 11/2009 |

OTHER PUBLICATIONS

Machine Translation JP 2009-256698. (Year: 2009).*

* cited by examiner

*Primary Examiner* — Rodney G McDonald

(57) ABSTRACT

A sputtering target includes: a base configured to transfer heat in a basal plane direction; and a first heat sink disposed on a sidewall of the base, the first heat sink configured to transfer heat along a direction that is different from the basal plane direction.

12 Claims, 6 Drawing Sheets

SPUTTERING TARGET AND MANUFACTURING METHOD THEREOF

CROSS-REFERENCE TO RELATED APPLICATION

The present application claims priority under 35 U.S.C. § 119(a) to Korean Patent Application Number 10-2018-0157444 filed on Dec. 7, 2018, the entire disclosure of which is incorporated herein by reference in its entirety.

BACKGROUND

1. Technical Field

The present disclosure generally relates to a target used in a sputtering process and a manufacturing method thereof.

2. Related Art

A semiconductor device is manufactured through a plurality of processes including a deposition process, an etching process, and the like. Among the plurality of processes, the deposition process includes a chemical vapor deposition, a physical vapor deposition, or the like.

Sputtering is a kind of physical vapor deposition, and performed using a sputtering apparatus. The sputtering apparatus generates an electric field in a high-vacuum chamber in which a small amount of inert gas exists, such that the inert gas is ionized by the electric field. After that, the ionized gas is accelerated to collide with a sputtering target, and atoms of the sputtering target are released due to the collision and then deposited on a substrate.

The quality, deposition speed, and the like of a layer deposited on the substrate through the sputtering are influenced by characteristics of the sputtering target. However, defects such as whisker or nodule may be generated at a surface of the sputtering target during the sputtering. Therefore, as the defects are generated, the sputtering target may be damaged, or the quality of the deposited layer may be deteriorated.

SUMMARY

Embodiments provide a sputtering target having less defects and a manufacturing method thereof.

According to an aspect of the present disclosure, there is provided a sputtering target including: a base configured to transfer heat in a basal plane direction; and a first heat sink disposed on a sidewall of the base, the first heat sink configured to transfer heat along a direction that is different from the basal plane direction.

According to another aspect of the present disclosure, there is provided a method of manufacturing a sputtering target, the method including: forming a base configured to transfer heat in a basal plane direction; partially removing a sidewall of the base, so that the base has a recessed sidewall in an inward direction of the base; and forming a heat sink on the recessed sidewall of the base, wherein the heat sink transfers heat along the sidewall.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. It will be understood that when an element is referred to as being "between" two elements, it can be the only element between the two elements, or one or more intervening elements may also be present between the two elements. Like reference numerals refer to like elements throughout.

DETAILED DESCRIPTION

Figure 1A:
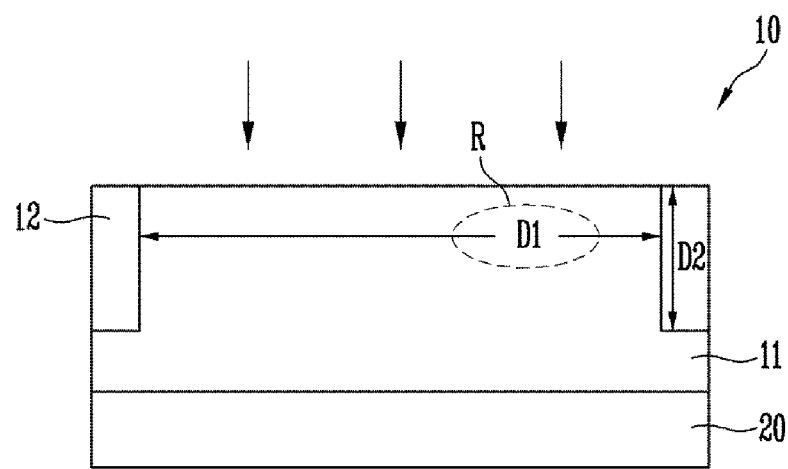
FIGS. 1A and 1B are cross-sectional views illustrating a structure of a sputtering target according to an embodiment of the present disclosure.

Hereinafter, various embodiments will be described in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). In a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
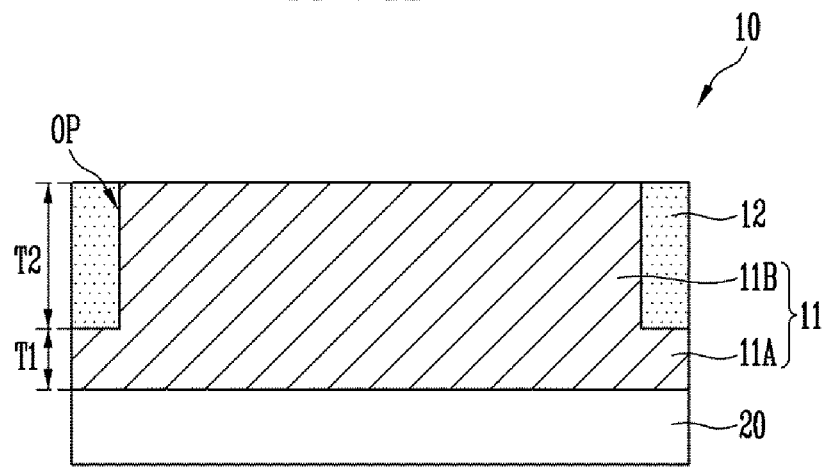

FIGS. 1A and 1B are cross-sectional views illustrating a structure of a sputtering target 10 according to an embodiment of the present disclosure.

Referring to FIG. 1A, the sputtering target 10 includes a base 11 and a heat sink 12. In an embodiment, the sputtering target 10 may be located on a back plate 20. In another embodiment, the back plate 20 may be provided as a part of the sputtering target 10.

The base 11 is used to provide a growth material when accelerated ions collide with the sputtering target 10 in a sputtering process, and includes a material corresponding to a layer to be deposited on a substrate in the sputtering process. When depositing a carbon layer that is used as a carbon electrode on the substrate in the sputtering process, the base 11 includes carbon. For example, the base 11 may include one or more of carbon, amorphous carbon, a graphite sheet, a pyrolytic graphite sheet, and the like, and be formed through deposition, sintering, or the like.

The base 11 may transfer heat in a specific direction according to the kind of material included therein, a crystal structure of the material, etc. When the base 11 includes carbon, the base 11 may transfer heat in a basal plane direction according to a bonding structure of carbon. For example, when the base 11 includes a plurality of pyrolytic graphite sheets stacked on the back plate 20, the base 11 transfers heat in a first direction D1, e.g., a basal plane direction, as shown in FIG. 1A. Therefore, heat concentrated in a specific region R in the sputtering process is mainly transferred along the first direction D1.

The heat sink 12 is used to distribute and radiate heat generating in the base 11. The heat sink 12 directly radiates heat transferred from the base 11, or distributes the heat. To this end, the heat sink 12 may include a material having a high thermal conductivity, or have a structure in which atoms are bonded so as to transfer heat in a predetermined direction. For example, the heat sink 12 may include a material having a crystal structure in which heat is transferred in a predetermined direction.

Referring to FIG. 1A, the heat sink 12 may transfer heat in a second direction D2 that is different from the first direction D1 in which the base 11 transfers the heat. For example, when the heat sink 12 includes graphite sheets stacked on a sidewall of the base 11, the heat sink 12 may transfer heat in the second direction D2 that is substantially orthogonal to the first direction D1. That is, the heat generating in the base 11 is transferred to the heat sink 12 along the first direction D1 and then distributed in the heat sink 12 along the second direction D2. Thus, the heat can be prevented from being concentrated at a specific level of the base 11 in a vertical direction with respect to the orientation of FIG. 1A, and the heat can be efficiently distributed and radiated.

The heat sink 12 may include a material having a crystal structure in which heat is transferred in a predetermined direction. The heat sink 12 and the base 11 may include the same material, different materials, or different allotropes. In an embodiment, the heat sink 12 may include a material having a thermal conductivity that is higher than that of the base 11. For example, the heat sink 12 may include a conductive material. The conductive material may include a metal such as copper or aluminum. The heat sink 12 can more easily radiate the heat transferred from the base 11.

According to the above-described structure, although heat is concentrated in the specific region R of the sputtering target 10 in the sputtering process, the heat can be easily distributed and radiated through the heat sink 12.

In the sputtering process, accelerated ions collide with the sputtering target 10, which generates heat in the base 11. However, when the heat is concentrated in the specific region R, defects such as whisker or nodule may be generated at a surface of the sputtering target 10 that corresponds to the specific region R. In particular, when the sputtering target 10 includes a material such as graphite, which transfers heat in a specific direction only, the heat is concentrated at a specific level of the sputtering target 10 in the vertical direction. Therefore, in the sputtering process, the sputtering target 10 may be damaged, or the quality of a layer deposited on a substrate may be deteriorated. Accordingly, the heat sink 12 is formed to distribute and radiate the heat concentrated in the specific region R of the base 11.

The heat sink 12 may additionally provide a path through which the heat is transferred in the sputtering target 10, so that the sputtering target 10 can be prevented from being locally heated. That is, the heat is transferred in the first direction D1 in the base 11, and then transferred in the second direction D2 in the heat sink 12, so that the path through which the heat is efficiently distributed and radiated can be provided in the heat sink 12.

Referring to FIG. 1B, the heat sink 12 may be connected to the base 11, and be in direct contact with the base 11. Also, in order to efficiently radiate the heat generating in the base 11, the heat sink 12 may be formed on the sidewall of the base 11, or be formed to surround the sidewall of the base 11.

Meanwhile, since the sputtering target 10 is disposed in a vacuum chamber to be exposed, electrons in the base 11 may be concentrated in the heat sink 12, which is formed on or surrounds the sidewall of the base 11, to be radiated. For example, when the heat sink 12 includes a conductive material, electrons are more concentrated in the heat sink 12. Accordingly, if the heat sink 12 and the back plate 20 are in contact with each other, arcing may occur at the heat sink 12.

Therefore, the heat sink 12 may be formed to be spaced apart from the back plate 20, not to be in direct contact with the back plate 20. For example, the base 11 may include a first region 11A provided between the back plate 20 and the heat sink 12 and a second region 11B provided over the first regions 11A. The second region 11B may be provided within an opening OP defined by the heat sink 12 and may have a width or diameter that is smaller than that of the first region 11A in a horizontal direction that is parallel to the top surface of the back plate 20. Therefore, the base 11 may have a step difference at the sidewall thereof. The heat sink 12 may be formed to surround a sidewall of the second region 11B, so that an inner sidewall of the heat sink 12 may be in direct contact with the sidewall of the second region 11B. An outer sidewall of the heat sink 12 may be aligned with a sidewall of the first region 11A. Accordingly, the sputtering target 10 including the base 11 and the heat sink 12 has an entirely uniform width or diameter.

When the first region 11A has a first thickness T1 and the second region 11B has a second thickness T2, the second region 11B and the first region 11A of the base 11 may have the substantially same thickness (T1=T2) or have different thicknesses (T1≠T2). The second region 11B may be substantially used as a target region where the accelerated ions collide, and the first region 11A may be used as a gap region for separating the back plate 20 and the heat sink 12 from each other. The second region 11B may have a thickness greater than that of the first region 11A, and a thickness ratio (T2:T1) of the second region 11B to the first region 11A may be 2:1 to 8:1. In an embodiment, when the second region 11B has a thickness of 8 mm or less, the first region 11A may have a thickness of 1 mm or more.

According to the above-described structure, the heat sink 12 and the back plate 20 are separated from each other by the first region 11A. Thus, the heat sink 12 and the back plate 20 are not in direct contact with each other, and occurrence of arcing can be prevented.

The sputtering target 10 according to the embodiment of the present disclosure may be used in a deposition process for forming a carbon electrode. The carbon electrode may be included in a volatile memory device, a nonvolatile memory device, etc. For example, the carbon electrode may be included in a Static Random Access Memory (SRAM), a Dynamic RAM (DRAM), a Synchronous DRAM (SDRAM), a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), etc.

Figure 2A:
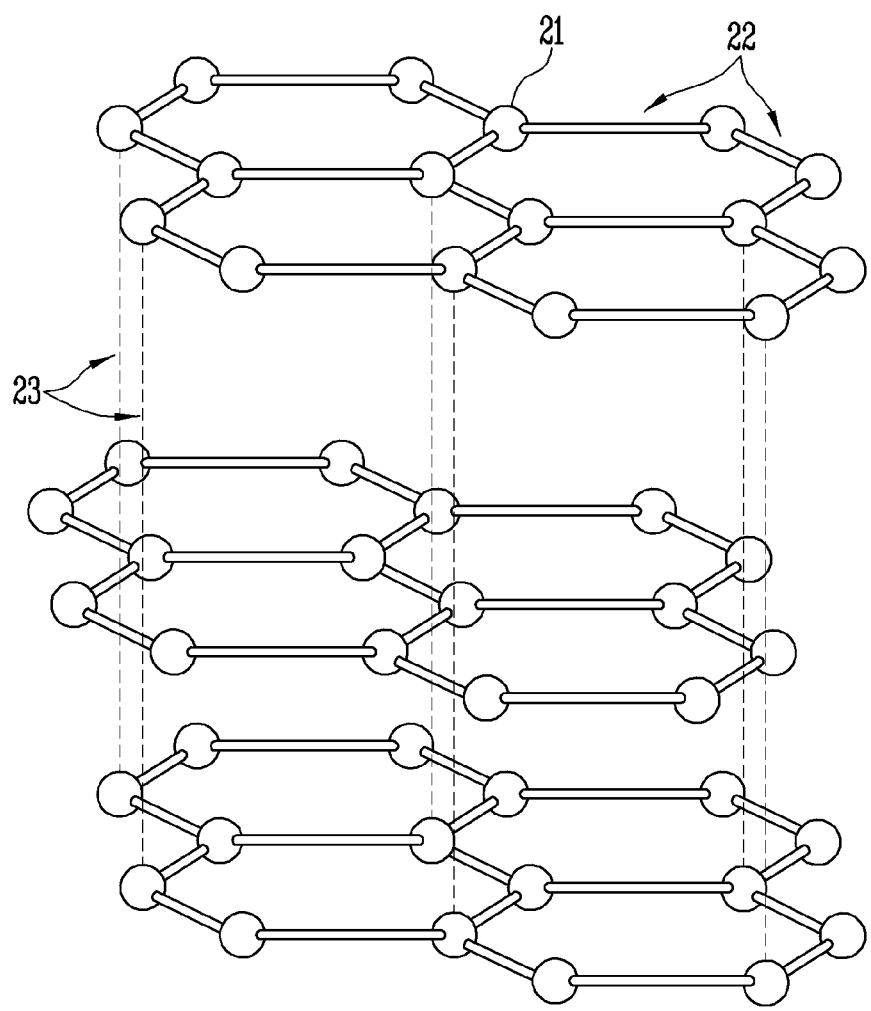
FIGS. 2A to 2C are views illustrating heat transfer characteristics of a sputtering target according to an embodiment of the present disclosure.
Figure 2B:
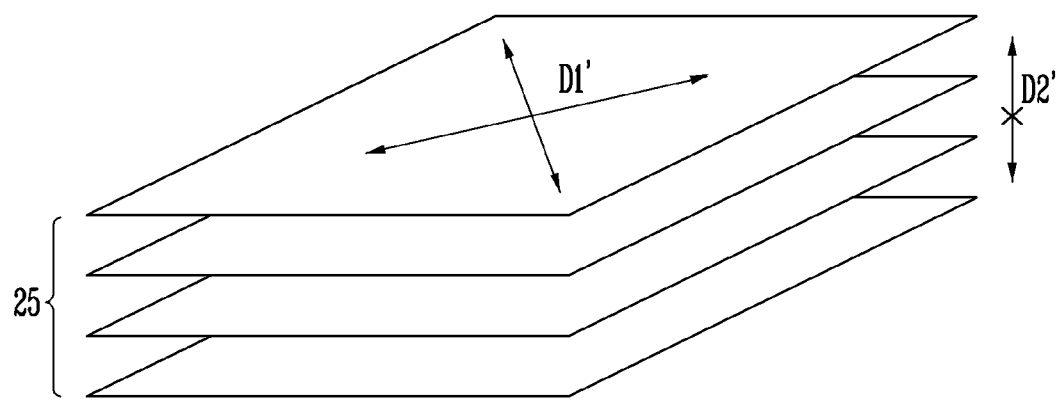
Figure 2C:
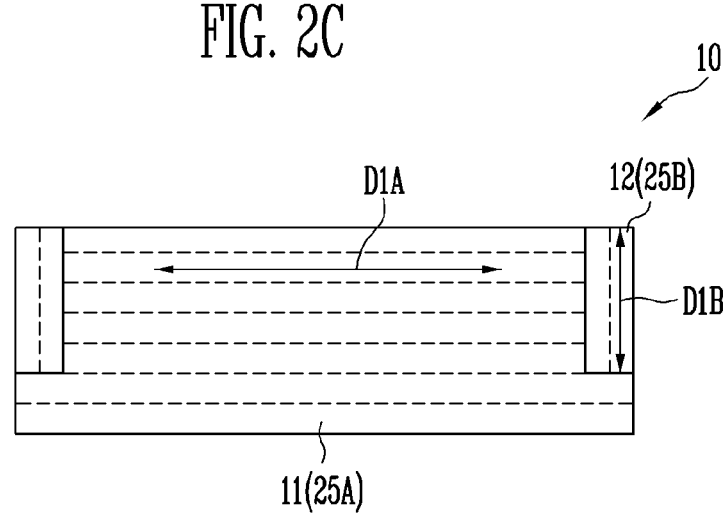

FIGS. 2A to 2C are views illustrating heat transfer characteristics of a sputtering target according to an embodiment of the present disclosure.

FIG. 2A illustrates a structure of graphite. The graphite is one of carbon allotropes, and includes a plane having a regular hexagonal network structure in which one carbon atom 21 forms a covalent bond with three other carbon atoms 21. In addition, the graphite includes a plurality of planes that maintain a layered structure by means of van der Waals forces 23.

FIG. 2B is a perspective view illustrating a heat transfer direction of stacked graphite sheets 25. The staked graphite sheets 25 constructs the sputtering target. The graphite sheets 25 have a high thermal conductivity in a basal plane direction D1, and have a low thermal conductivity in a stack direction D2' that is orthogonal to the basal plane direction D1'. Therefore, heat generating in the graphite sheets 25 is mainly transferred in the basal plane direction D1', and is hardly transferred in the stack direction D2'.

Referring to FIG. 2C, a sputtering target 10 may have different basal plane directions D1A and D1B depending on regions. As the basal plane directions D1A and D1B are differently set depending on regions, heat generating in the sputtering target 10 can be transferred and radiated in a plurality of directions.

In FIG. 2C, the sputtering target 10 includes a base 11 and a heat sink 12. The base 11 includes first graphite sheets 25A having the first basal plane direction D1A, and the heat sink 12 includes second graphite sheets 25B having the second basal plane direction D1B. The second graphite sheets 25B are stacked on sidewalls of some of the first graphite sheets 25BA to surround the sidewalls of some of the first graphite sheets 25BA. Thus, the first basal plane direction D1A and the second basal plane direction D1B may be orthogonal to each other. Heat generating in the base 11 is transferred along the first basal plane direction D1A in the base 11, and then transferred and radiated along the second basal plane direction D1B in the heat sink 12. Accordingly, heat can be prevented from being concentrated in a specific region of the sputtering target 10 and at a specific level of the sputtering target 10 in a vertical direction with respect to the orientation of FIG. 2C.

Figure 3:
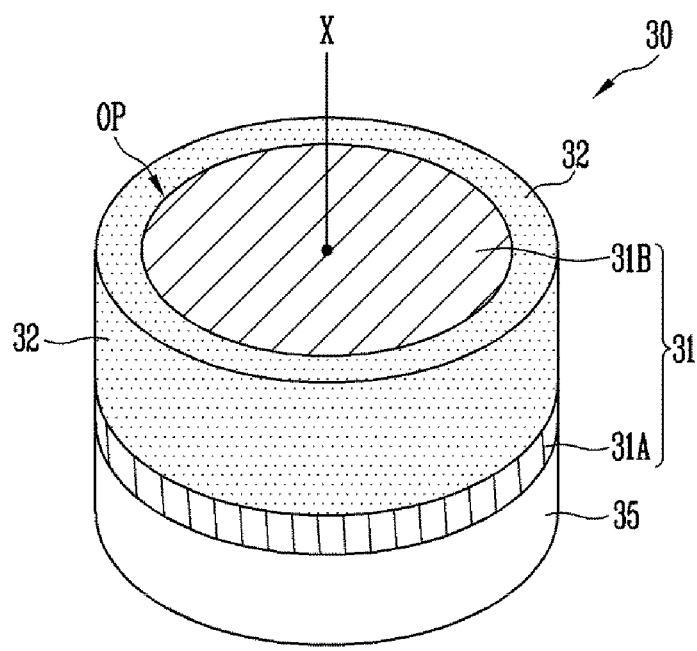
FIG. 3 is a perspective view illustrating a structure of a sputtering target according to an embodiment of the present disclosure.

FIG. 3 is a perspective view illustrating a structure of a sputtering target 30 according to an embodiment of the present disclosure.

Referring to FIG. 3, the sputtering target 30 may include a base 31 and a heat sink 32. The heat sink 32 may surround a portion of the entire height of the base 31 so that the heat sink 32 is spaced apart from a back plate 35. The base 31 may include a first region 31A and a second region 31B. In this case, the heat sink 32 may surround the second region 31B of the base 31 (or the second region 31B is provided within the opening OP defined by the heat sink 32).

The base 31 may have a plane formed in a circular shape, an elliptical shape, a quadrangular shape, a polygonal shape, or the like. The base 31 may have a symmetric shape or an asymmetric shape with respect to an axis X connecting central points of the first region 31A and the second region 31B. In an embodiment, with respect to the axis X, the heat sink 32 may have a cross-section of a ring structure that surrounds the entire sidewall of the second region 31B. For example, the heat sink 32 may surround the second region 31B 360 degrees. In another embodiment, with respect to the axis X, the heat sink 32 may surround only a portion of the entire sidewall of the second region 31B. For example, the heat sink 32 may surround the second region 31B at a predetermined angle less than 360 degrees.

Figure 4A:
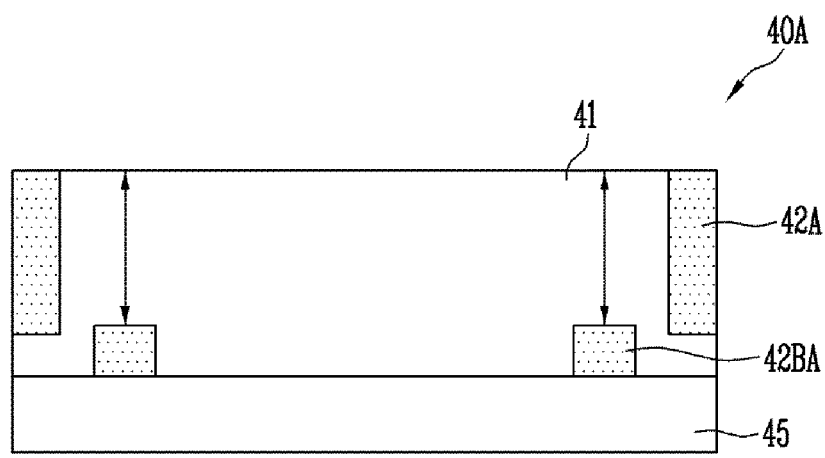
FIGS. 4A and 4B are cross-sectional views illustrating sputtering targets according to other embodiments of the present disclosure.
Figure 4B:
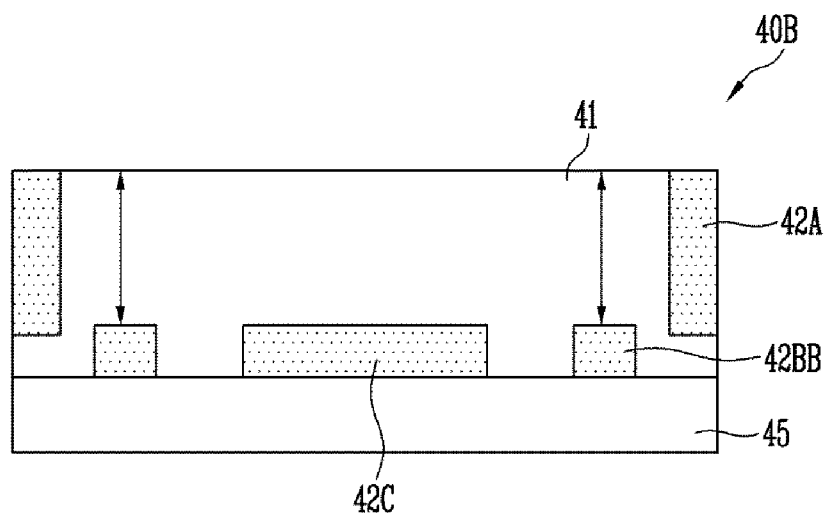

FIGS. 4A and 4B are cross-sectional views illustrating sputtering targets according to other embodiments of the present disclosure. Hereinafter, contents overlapping with the above-described contents will be omitted. In FIGS. 4A and 4B, same reference numerals refer to same elements.

Referring to FIG. 4A, a sputtering target 40A may include a base 41, a first heat sink 42A, and a second heat sink 42BA, and the base 41 may be located on a back plate 45.

The first heat sink 42A may be formed to surround a sidewall of the base 41. Since the first heat sink 42A is exposed in a chamber where the sputtering target 40A is disposed, the first heat sink 42A may be spaced apart from the back plate 45 so as to prevent occurrence of arcing. The second heat sink 42BA may be formed in the base 41 to be in contact with a top surface of the back plate 45. Since the second heat sink 42BA is formed in the base 41, the second heat sink 42BA may not be exposed in the chamber.

The sputtering target 40A may include a plurality of heat sinks, e.g., the first heat sink 42A and the second heat sink 42BA, and the height (or thickness) and width of the second heat sink 42BA may be variously adjusted. The second heat sink 42BA may be located by considering an erosion area of the sputtering target 40A.

A sputtering apparatus forms an electric field by applying a bias voltage to electrodes disposed in a chamber, and allows plasma ions to be accelerated by the electric field, so that the accelerated plasma ions collide with a sputtering target. A magnetic part for forming the electric field may be a permanent magnet, an electromagnet, or the like, which has N and S poles, and the magnetic part may be rotated in the chamber. Therefore, some portions of a top surface of the sputtering target may be more quickly eroded according to a rotation direction of the magnetic part, a rotation speed of the magnetic part, etc., and thus heat generating in the sputtering target may be concentrated in an erosion area.

Referring to FIG. 4A, the second heat sink 42BA may be located in the base 41 by considering the erosion area that is indicated by arrows. That is, the second heat sink 42BA may be disposed corresponding to the erosion area. Therefore, the heat, which is concentrated in the erosion area, can be efficiently distributed and radiated through the second heat sink 42BA. The second heat sink 42BA may have a plane formed in a circular shape, an elliptical shape, a quadrangular shape, a polygonal shape, etc.

Referring to FIG. 4B, a sputtering target 40B may include a base 41, and first to third heat sinks 42A, 42BB, and 42C. The first heat sink 42A may have the same structure as that illustrated in FIG. 4A. The second heat sink 42BB may be located at the periphery of an erosion area indicated by arrows. The third heat sink 42C may be located at the center of a bottom of the sputtering target 40B. The second and third heat sink 42BB and 42C may be formed in the base 41 to be in contact with a top surface of a back plate 45.

For example, the second and third heat sinks 42BB and 42C may have a uniform thickness or have different thicknesses. In an embodiment, the third heat sink 42C has a width greater than that of the second heat sink 42BB located at an edge of the bottom of the sputtering target 40B. In an embodiment, the second heat sink 42BB may have a cross-section of a ring structure that surrounds the third heat sink 42C.

According to the above-described structures illustrated in FIGS. 4A and 4B, the sputtering target includes both the first heat sink located on the sidewall of the base 41 and at least one of the second and third heat sinks located in the base 41, so that the heat generating in the sputtering target can be more efficiently distributed and radiated through the heat sinks.

Figure 5A:
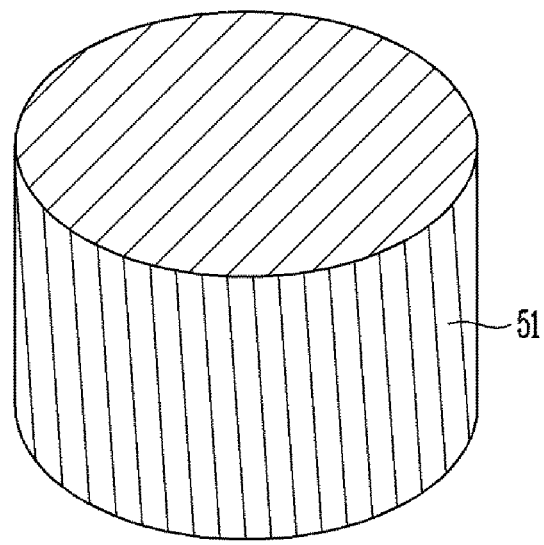
FIGS. 5A to 5C are perspective views illustrating a method of manufacturing a sputtering target according to an embodiment of the present disclosure.
Figure 5B:
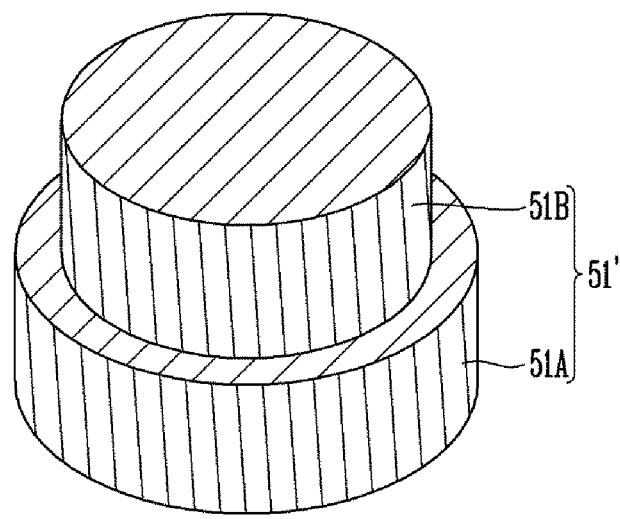
Figure 5C:
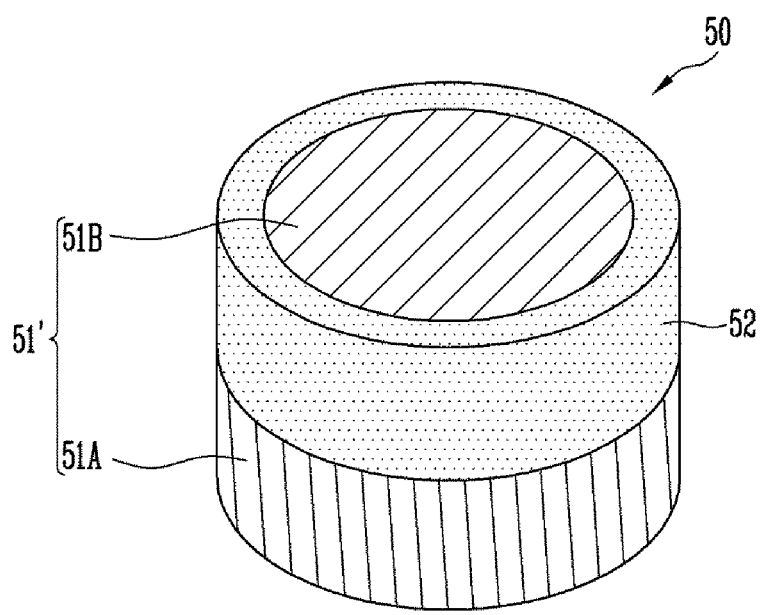

FIGS. 5A to 5C are perspective views illustrating a method of manufacturing a sputtering target according to an embodiment of the present disclosure.

Referring to FIG. 5A, a base 51 is formed. The base 51 may include carbon, and be formed through calcination, deposition, sintering, or the like. In an embodiment, pyrolytic graphite can be formed as the base 51 by depositing carbon on a substrate. The deposition of carbon is performed by thermally decomposing a hydrocarbon gas such as $CH_4$, $C_2H_2$, or $C_3H_6$. In another embodiment, a graphite sheet may be formed as the base 51 by mixing raw materials such as graphite, cokes, and coal-tar pitch, pressing the mixture, performing sintering and pitch impregnation, and then performing a graphitization process, a purification process, and the like. The base 51 may be a carbon disk, etc. The base 51 may be formed directly on a back plate. Alternately, after the base 51 is formed, the base 51 may be attached onto the back plate.

Referring to FIG. 5B, a sidewall of the base 51 is partially removed through machining, so that a sidewall of a part of the base 51 is recessed in an inward direction of the base 51. Accordingly, a base 51' including a first region 51A and a second region 51B may be formed. The second region 51B corresponds to the part of the base 51 that has the recessed sidewall. Therefore, a width of the second region 51B is smaller than that of the first region 51A, and the second region 51B may be disposed on the first region 51A in a vertical direction with respect to the orientation of FIG. 5B.

Referring to FIG. 5C, a heat sink 52 is formed on the recessed sidewall of the base 51'. For example, the heat sink 52 may be formed on the sidewall of the second region 51B of the base 51'. The heat sink 52 may include carbon, a conductive material, a metallic material, or the like. In an embodiment, after the heat sink 52 is formed in a shape of a film or tape, the heat sink 52 may be attached to the sidewall of the second region 51B of the base 51'. In another embodiment, the heat sink 52 may be coated on the sidewall of the second region 51B of the base 51'. In still another embodiment, after the heat sink 52 is formed in a shape of an O-ring, the heat sink 52 may be fitted around the sidewall of the second region 51B.

According to the above-described manufacturing method, a sputtering target 50 including the base 51' and the heat sink 52 can be manufactured.

According to the embodiments of the present disclosure, a sputtering target for efficiently distributing and radiating heat generating in the sputtering target is provided, so that it is possible to significantly prevent defects from being generated in the sputtering target.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A sputtering target comprising:
   a base including first graphite sheets stacked on top of another to transfer heat in a first basal plane direction of the first graphite sheets; and
   a first heat sink including second graphite sheets stacked on a sidewall of the base so that a second basal plane direction of the second graphite sheets is different from the first basal plane direction, wherein the first heat sink transfers heat in the second basal plane direction.

2. The sputtering target of claim 1, wherein the second basal plane direction is substantially orthogonal to the first basal plane direction.

3. The sputtering target of claim 1, wherein the base includes a first region and a second region disposed over the first region, the second region having a width narrower than a width of the first region.

4. The sputtering target of claim 3, wherein the second region is provided within an opening defined by the first heat sink.

5. The sputtering target of claim 1, further comprising:
   a second heat sink disposed in the base.

6. The sputtering target of claim 1,
   wherein, in the base, the heat is transferred in the first basal plane direction more than a direction parallel to the sidewall of the base, and
   wherein, in the first heat sink, the heat is transferred in the second basal plane direction more than the first basal plane direction.

7. The sputtering target of claim 1, wherein the second basal plane direction is parallel to the sidewall of the base.

8. A sputtering target comprising:
   a base including first graphite sheets to transfer heat in a first direction more than a second direction, wherein the first direction is parallel to a first basal plane of the first graphite sheets and the second direction is parallel to a sidewall of the base; and
   a first heat sink surrounding the sidewall of the base and including a material to transfer heat in the second direction more than the first direction.

9. The sputtering target of claim 8, wherein the first heat sink includes a material having a thermal conductivity that is higher than that of the base.

10. The sputtering target of claim 8, wherein the first heat sink includes carbon, a conductive material, or a combination thereof.

11. The sputtering target of claim 8, wherein the first heat sink includes second graphite sheets stacked on the sidewall of the base.

12. The sputtering target of claim 8, further comprising:
   a second heat sink disposed in the base.

* * * * *